(12) United States Patent
Xiao et al.

(10) Patent No.: US 9,171,703 B2
(45) Date of Patent: Oct. 27, 2015

(54) APPARATUS WITH SIDEWALL PROTECTION FOR FEATURES

(71) Applicant: SEAGATE TECHNOLOGY LLC, Cupertino, CA (US)

(72) Inventors: Shuaigang Xiao, Fremont, CA (US); David Kuo, Palo Alto, CA (US); Kim Y. Lee, Fremont, CA (US); XiaoMin Yang, Livermore, CA (US); Justin Hwu, Fremont, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/137,792

(22) Filed: Dec. 20, 2013

(65) Prior Publication Data

US 2015/0179414 A1 Jun. 25, 2015

(51) Int. Cl.
*G03F 7/26* (2006.01)
*H01J 37/32* (2006.01)
*C23C 16/01* (2006.01)
*C23C 14/34* (2006.01)

(52) U.S. Cl.
CPC ........... *H01J 37/32651* (2013.01); *C23C 14/34* (2013.01); *C23C 16/01* (2013.01); *H01J 2237/0203* (2013.01); *H01J 2237/026* (2013.01); *H01J 2237/3341* (2013.01)

(58) Field of Classification Search
CPC ........... G03F 7/36; G03F 7/075; G03F 7/265; G03F 7/40; G03F 7/00; H01L 21/0274; H01L 21/76802; H01L 45/1691; H01L 21/32139
USPC ........... 430/322, 270.1, 314, 9, 315
See application file for complete search history.

(56) References Cited

U.S. PATENT DOCUMENTS

| | | | |
|---|---|---|---|
| 6,100,014 A * | 8/2000 | Lin et al. | 430/314 |
| 6,214,737 B1 * | 4/2001 | Lyons et al. | 438/706 |
| 6,734,107 B2 | 5/2004 | Lai et al. | |
| 7,629,259 B2 | 12/2009 | Sadjadi | |
| 7,758,981 B2 | 7/2010 | Albrecht | |
| 8,512,583 B2 | 8/2013 | Bonhote et al. | |
| 2005/0186405 A1 | 8/2005 | Jeong et al. | |
| 2011/0266667 A1 | 11/2011 | Wu et al. | |

* cited by examiner

*Primary Examiner* — Caleen Sullivan

(57) ABSTRACT

Provided herein is an apparatus, including a patterned resist overlying a substrate; a number of features of the patterned resist, wherein the number of features respectively includes a number of sidewalls; and a sidewall-protecting material disposed about the number of sidewalls, wherein the sidewall-protecting material is characteristic of a conformal, thin-film deposition, and wherein the sidewall-protecting material facilitates a high-fidelity pattern transfer of the patterned resist to the substrate during etching.

25 Claims, 9 Drawing Sheets

APPARATUS WITH SIDEWALL PROTECTION FOR FEATURES

BACKGROUND

Patterning features at high resolutions can be difficult. Difficulty in patterning features may include, for example, one or more difficulties in pattern transfer, which can lead to variations in the transferred pattern including variations in feature size and/or shape, as well as feature position. In view of the foregoing, patterning features at high resolutions can be difficult due to one or more difficulties in pattern transfer.

SUMMARY

Provided herein is an apparatus, including a patterned resist overlying a substrate; a number of features of the patterned resist, wherein the number of features respectively includes a number of sidewalls; and a sidewall-protecting material disposed about the number of sidewalls, wherein the sidewall-protecting material is characteristic of a conformal, thin-film deposition, and wherein the sidewall-protecting material facilitates a high-fidelity pattern transfer of the patterned resist to the substrate during etching.

These and other features and/or aspects of the concepts provided herein may be better understood with reference to the following drawings, description, and appended claims.

DRAWINGS

Figure 1A:
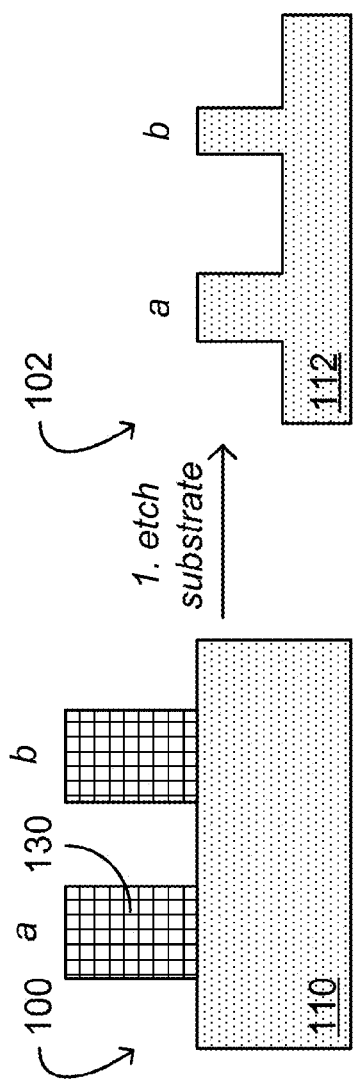
Figure 1B:
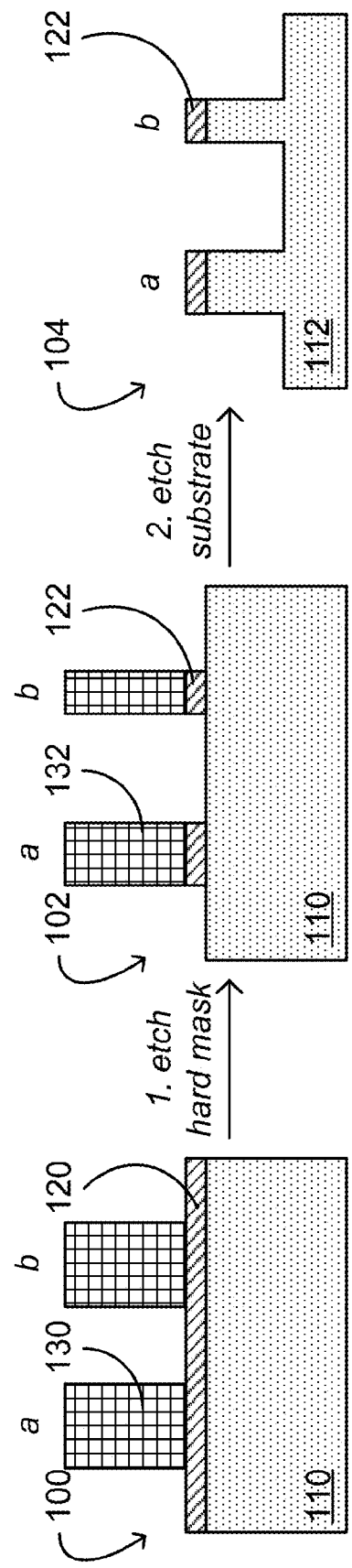
Figures 1C, 1D:
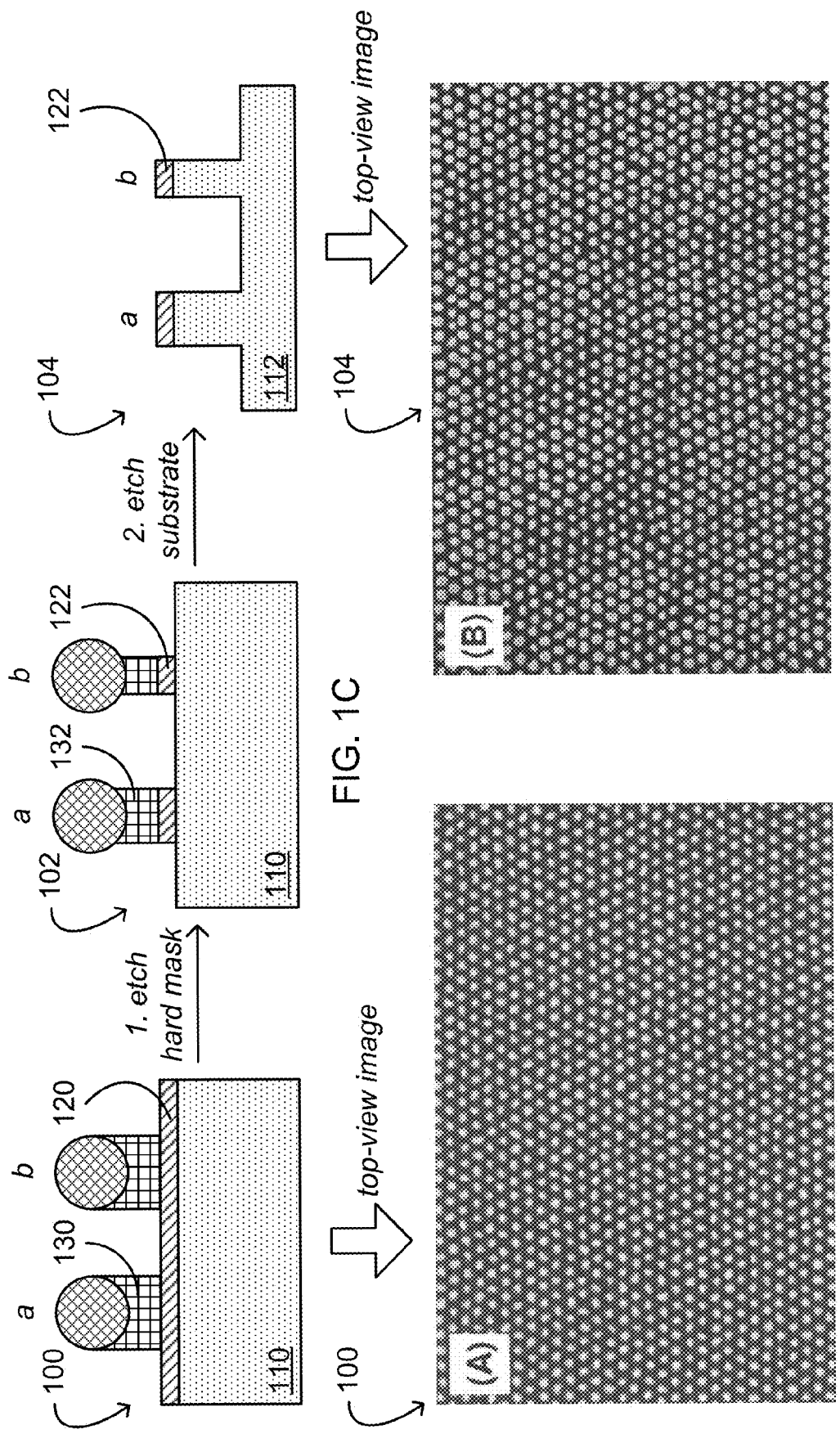

FIGS. 1A-1C provide schematics illustrating difficulties in pattern transfer at high resolutions.

FIG. 1D provides images corresponding to the schematic of FIG. 1C illustrating difficulties in pattern transfer at high resolutions.

Figure 2:
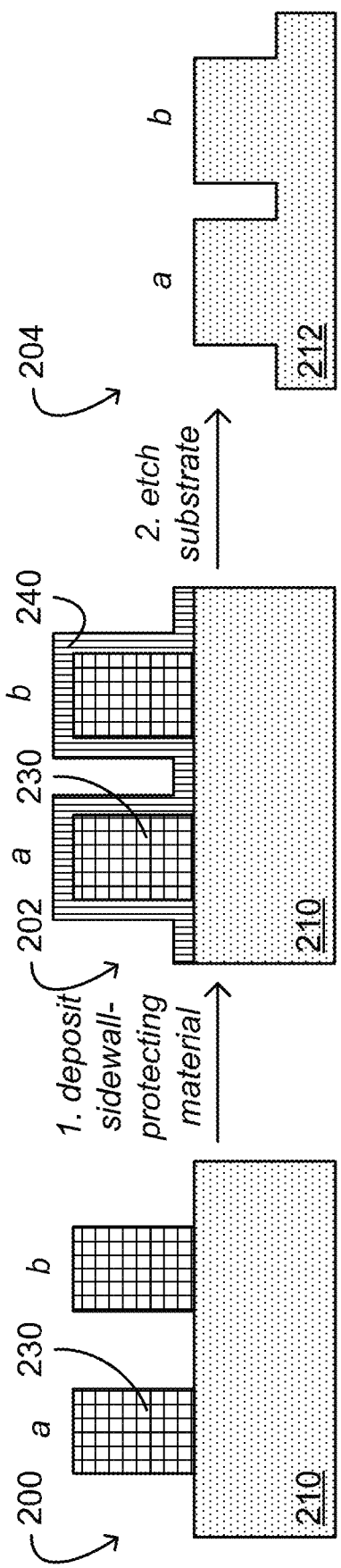

FIG. 2 provides a schematic illustrating sidewall protection for high-fidelity pattern transfer according to one aspect.

Figure 3:
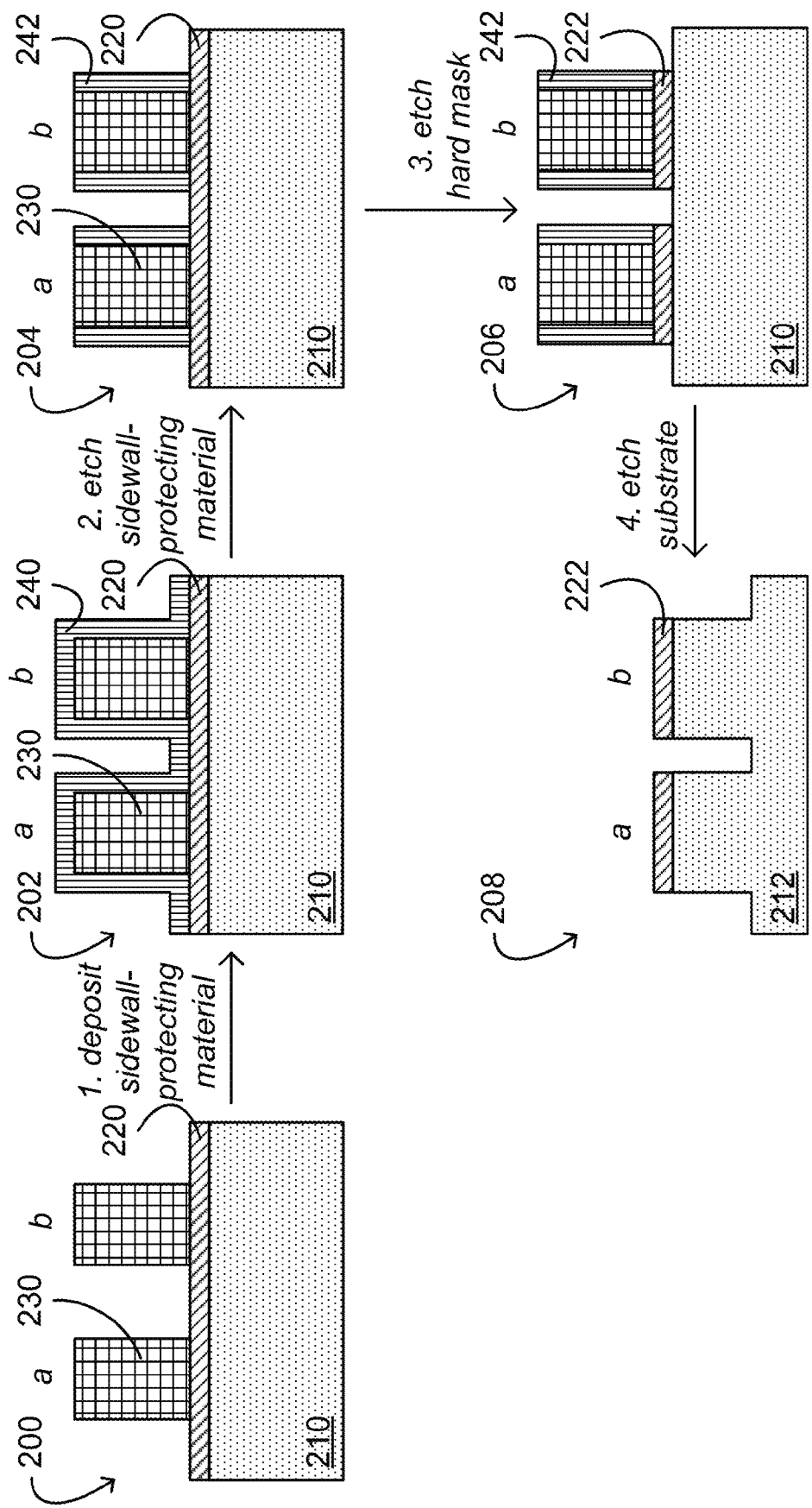

FIG. 3 provides a schematic illustrating sidewall protection for high-fidelity pattern transfer according to one aspect.

Figure 4:
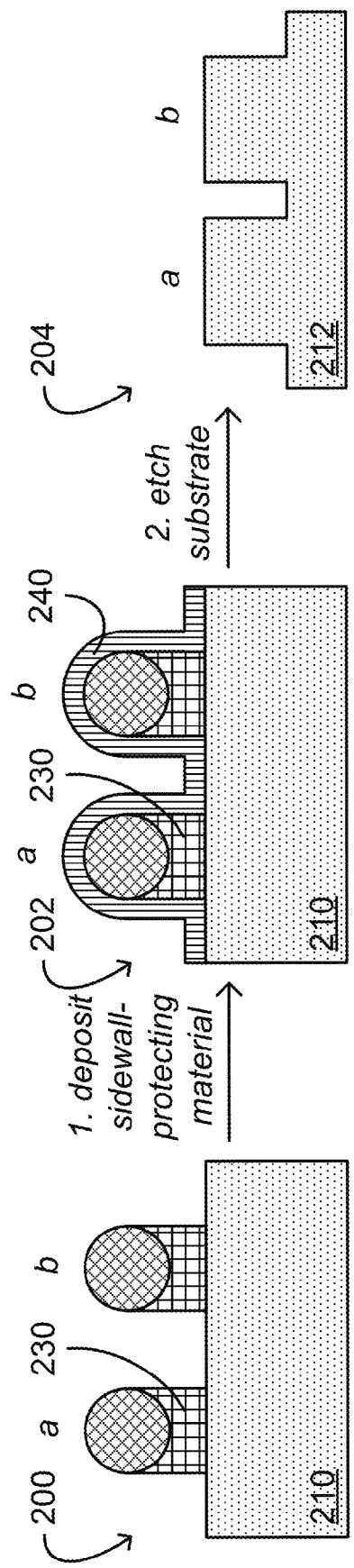

FIG. 4 provides a schematic illustrating sidewall protection for high-fidelity pattern transfer according to one aspect.

Figure 5:
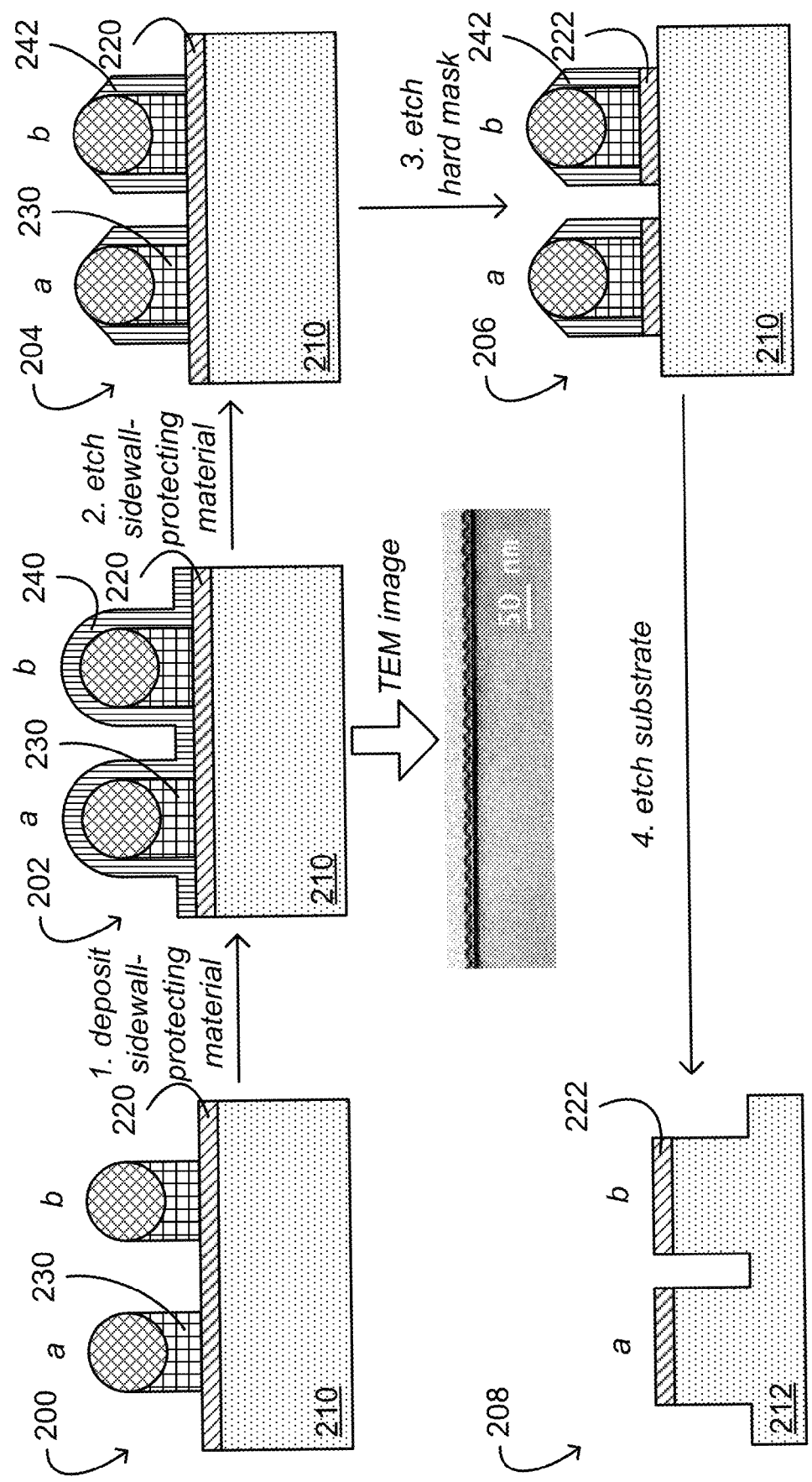

FIG. 5 provides a schematic illustrating sidewall protection for high-fidelity pattern transfer according to one aspect.

Figures 6A, 6B:
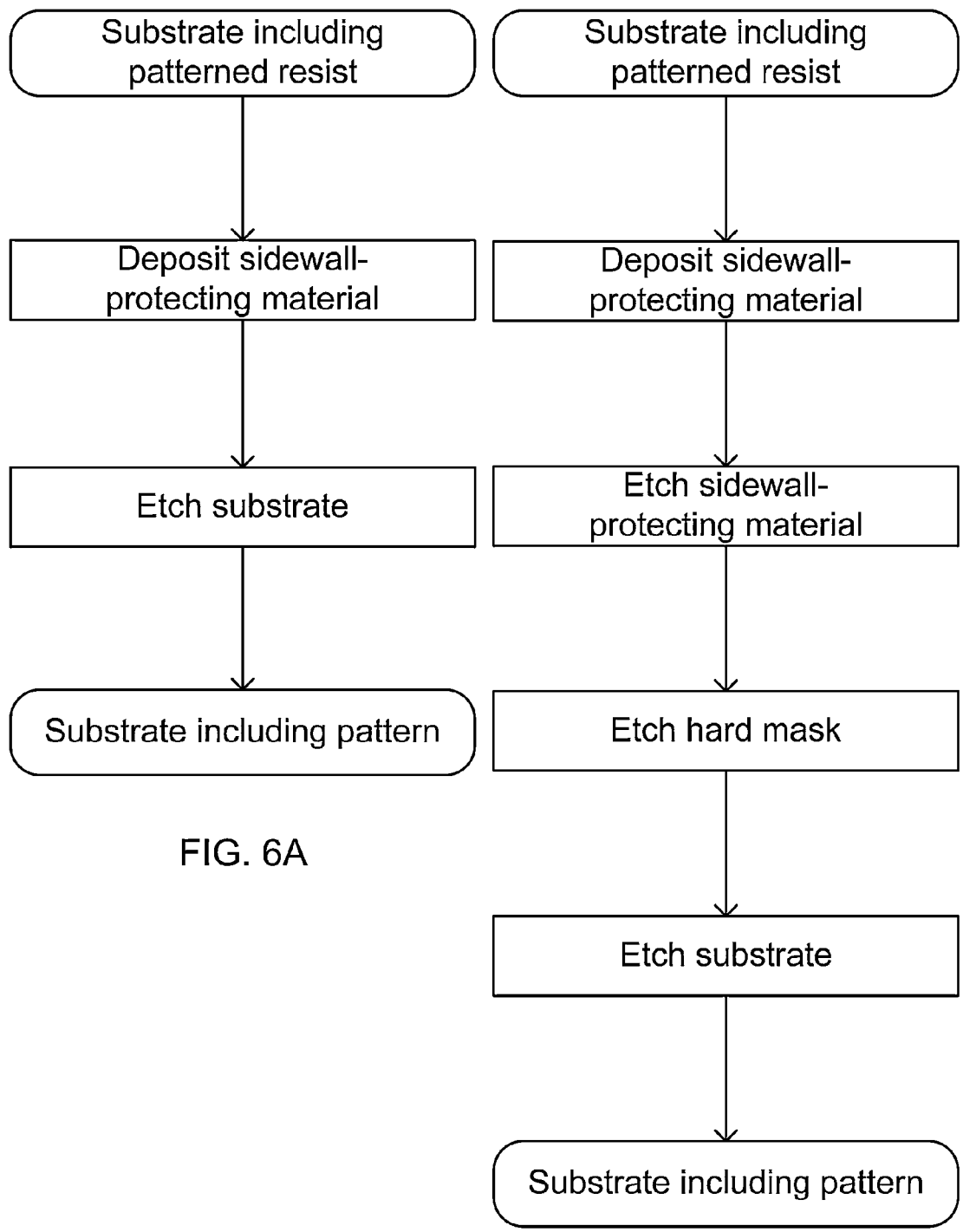

FIG. 6A provides a flow chart for high-fidelity pattern transfer using sidewall protection according to one aspect.

FIG. 6B provides a flow chart for high-fidelity pattern transfer using sidewall protection according to one aspect.

Figure 7:
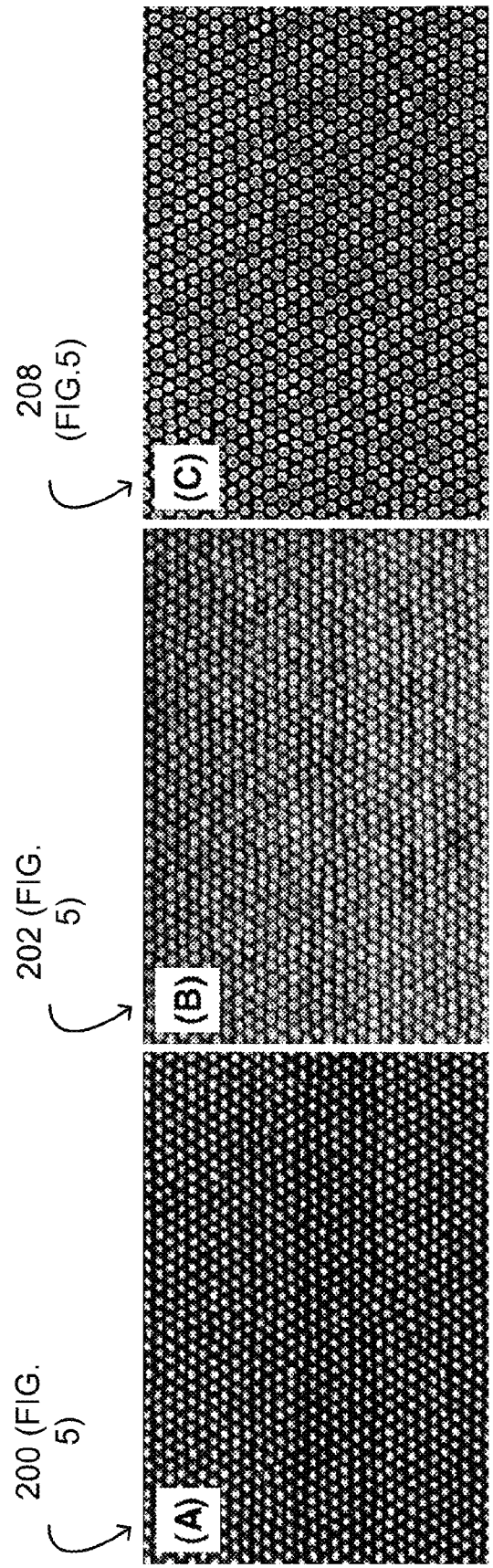

FIG. 7 provides top-view images corresponding to one or more apparatuses of FIG. 5.

Figure 8:
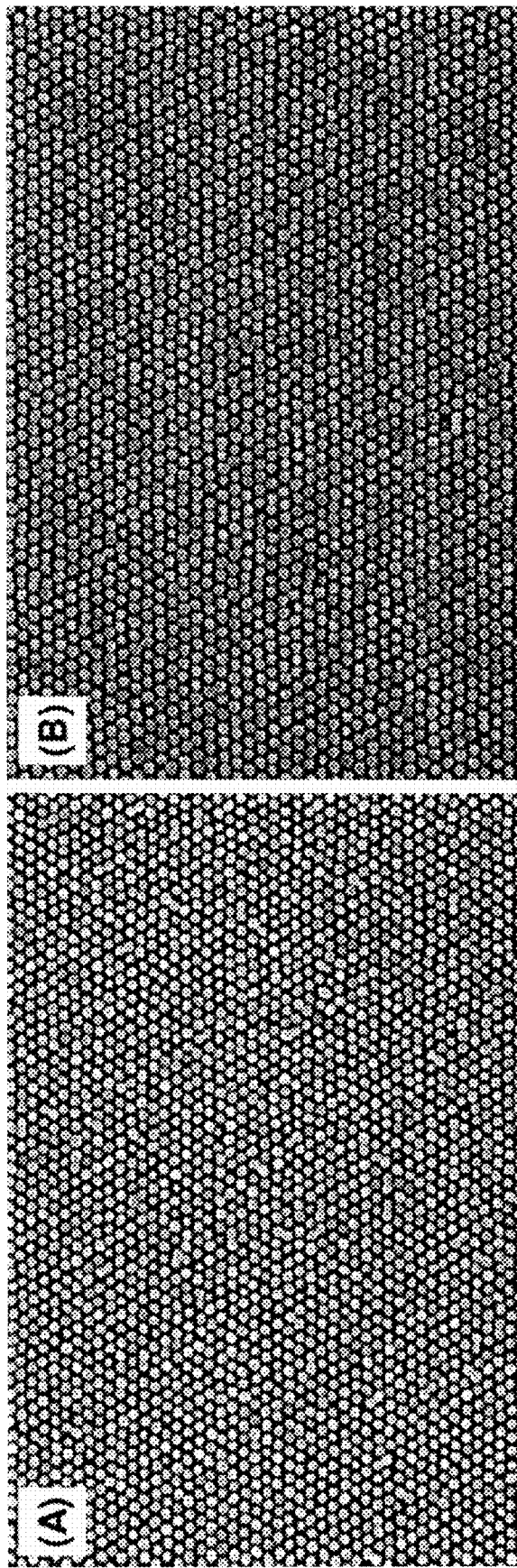

FIG. 8 provides top-view images corresponding to one or more apparatuses of FIG. 5.

DESCRIPTION

Before some particular embodiments are illustrated and/or described in greater detail, it should be understood by persons having ordinary skill in the art that the particular embodiments provided herein do not limit the scope of the concepts provided herein, as features of such particular embodiments may vary. It should likewise be understood that a particular embodiment provided herein has features that may be readily separated from the particular embodiment and optionally combined with or substituted for features of any of a number of other embodiments illustrated and/or described herein.

It should also be understood by persons having ordinary skill in the art that the terminology used herein is for the purpose of describing the particular embodiments, and the terminology does not limit the scope of the concepts provided herein. Unless indicated otherwise, ordinal numbers (e.g., first, second, third, etc.) are used to distinguish or identify different features or steps in a group of features or steps, and do not supply a serial or numerical limitation. For example, "first," "second," and "third" features or steps need not necessarily appear in that order, and the particular embodiments need not necessarily be limited to the three features or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Unless defined otherwise, all technical and scientific terms used herein have the same meaning as commonly understood by persons of ordinary skill in the art.

Patterning features at high resolutions including, but not limited to, ultra-high resolutions greater than or equal to 1 trillion features or terafeatures per square inch (e.g., ≥1 Tfpsi or ≥1 Tf/in$^2$) can be difficult. Difficulty in patterning features may include, for example, one or more difficulties in pattern transfer at ≥1 Tfpsi, which can lead to variations in the transferred patterns including variations in feature size and/or shape, as well as feature position, which variations can get progressively worse over a number of successive pattern-transfer steps. FIGS. 1A-1C provide schematics illustrating some difficulties in pattern transfer at high resolutions.

FIG. 1A, for example, illustrates an apparatus 100 in cross-section including a substrate 110, a patterned resist or soft mask 130 overlying the substrate 110, and features a and b, which features a and b may be of a certain size and/or shape with a certain center-to-center pitch for transferring to the underlying substrate 110. The features a and b of the patterned resist 130 may be subsequently transferred to the substrate 110 of the apparatus 100 by a substrate-etching process such as reactive-ion etching ("RIE") yielding apparatus 102 including etched substrate 112 having features a and b. While the features a and b of apparatus 100 are of a certain size and/or shape with a certain center-to-center pitch, the features a and b of apparatus 102 are of different sizes and/or shapes with different center-to-center pitches illustrating at least one of the difficulties in pattern transfer at high resolution. The different sizes and/or shapes with different center-to-center pitches of the features a and b of the apparatus 102 may be compounded by descumming the patterned resist 130 prior to the substrate-etching process, which descumming may inadvertently affect the features a and b of apparatus 100 through over descumming. As such, over descumming is at least one more of the difficulties in pattern transfer at high resolution.

FIG. 1B, for example, illustrates an apparatus 100 in cross-section including a substrate 110, a hard mask 120 overlying the substrate 110, a patterned resist or soft mask 130 overlying the hard mask 120, and features a and b, which features a and b may be of a certain size and/or shape with a certain center-to-center pitch for transferring to the underlying substrate 110. The features a and b of the patterned resist 130 may be subsequently transferred to the hard mask 120 of the apparatus 100 by a hard mask-etching process (e.g., RIE) yielding apparatus 102 including etched hard mask 122 as part of features a and b. While the features a and b of apparatus 100 are of a certain size and/or shape with a certain center-to-center pitch, the features a and b of apparatus 102 are of different sizes and/or shapes with different center-to-center pitches illustrating at least one of the difficulties in pattern transfer at high resolution. The features a and b of the patterned resist 132 and hard mask 122 may be subsequently transferred to the substrate 110 of the apparatus 102 by a substrate-etching process (e.g., RIE) yielding apparatus 104 including etched substrate 112 having features a and b. While the features a and b of apparatus 102 are of a certain size and/or shape with a certain center-to-center pitch, albeit different than that of apparatus 100, the features a and b of apparatus 104 are of different sizes and/or shapes with different center-to-center pitches illustrating at least one more of the difficulties in pattern transfer at high resolution. The different sizes and/or shapes with different center-to-center pitches of the features a and b of the apparatus 104 may be compounded by descumming the patterned resist 130 prior to the hard mask-etching process, which descumming may inadvertently affect the features a and b of apparatus 100 through over descumming. As such, over descumming is at least one more of the difficulties in pattern transfer at high resolution.

FIG. 1C, for example, illustrates an apparatus 100 in cross-section including a substrate 110, a hard mask 120 overlying the substrate 110, a patterned resist or soft mask 130 overlying the hard mask 120, and features a and b, which features a and b may be sphere-and-pillar-type features, and which features a and b may be of a certain size and/or shape with a certain center-to-center pitch for transferring to the underlying substrate 110. Image (A) of FIG. 1D provides a top-view image of the apparatus 100 with features of the patterned resist 130 of a certain size and/or shape with a certain center-to-center pitch. The features a and b of the patterned resist 130 may be subsequently transferred to the hard mask 120 of the apparatus 100 by a hard mask-etching process (e.g., RIE) yielding apparatus 102 including etched hard mask 122 as part of features a and b. While the features a and b of apparatus 100 are of a certain size and/or shape with a certain center-to-center pitch, the features a and b of apparatus 102 are of different sizes and/or shapes with different center-to-center pitches illustrating at least one of the difficulties in pattern transfer at high resolution. With respect to the shape, the sphere-and-pillar-type features a and b of apparatus 102 may experience undercutting during the hard mask-etching process, illustrating at least one more of the difficulties in pattern transfer at high resolution. The features a and b of the patterned resist 132 and hard mask 122 may be subsequently transferred to the substrate 110 of the apparatus 102 by a substrate-etching process (e.g., RIE) yielding apparatus 104 including etched substrate 112 having features a and b. While the features a and b of apparatus 102 are of a certain size and/or shape with a certain center-to-center pitch, albeit different than that of apparatus 100, the features a and b of apparatus 104 are of different sizes and/or shapes with different center-to-center pitches illustrating at least one more of the difficulties in pattern transfer at high resolution. Image (B) of FIG. 1D provides a top-view image of the apparatus 104 with features of the etched substrate 112 of different sizes and/or shapes with different center-to-center pitches. As provided herein, over descumming is at least one more of the difficulties in pattern transfer at high resolution.

In view of the foregoing, patterning features at high resolutions can be difficult due to at least one or more of the foregoing difficulties in pattern transfer, providing grounds for apparatuses and methods provided herein. As such, provided herein are apparatuses and methods for maintaining pattern fidelity during pattern transfer, high-fidelity pattern transfer, and/or minimizing deterioration in the quality of transferred patterns, which apparatuses and methods include, but are not limited to, sidewall protection for features for facilitating the foregoing (e.g., high-fidelity pattern transfer). FIGS. 2-5, 6A, and 6B provide examples of apparatuses and methods including sidewall protection for features for maintaining pattern fidelity during pattern transfer, high-fidelity pattern transfer, and/or minimizing deterioration in the quality of transferred patterns through sidewall protection; however, FIG. 3 also provides a non-limiting example and basis for describing certain general features of apparatuses and methods provided herein. As such, FIG. 3. will now be described with respect to certain general features of apparatuses and methods provided herein.

FIG. 3, for example, provides a schematic illustrating an apparatus 202 in cross-section including a substrate 210; an optional hard mask 220 overlying the substrate 210; a patterned resist or soft mask 230 overlying the hard mask 220 and/or the substrate 210; a sidewall-protecting material 240 overlying the patterned resist 230, the hard mask 220, and/or the substrate 210; and features a and b, which features a and b may be of a certain size and/or shape with a certain center-to-center pitch for transferring to the underlying substrate 110, each of which will now be described in turn.

With respect to the apparatus (e.g., apparatus 202 of FIG. 3), the apparatus may include, but is not limited to, an apparatus selected from a semiconductor device (e.g., a two-terminal device such as a light-emitting diode ["LED"], a photocell, a solar cell, etc.; a multi-terminal device such as an integrated circuit ["IC"], a charge-coupled device ["CCD"], a microprocessor, a random-access memory ["RAM"], a read-only memory ["ROM"], etc.; etc.), a recording device (e.g., a patterned recording medium such as bit-patterned media ["BPM"]), a workpiece thereof, and a related piece thereof, including an imprint template (e.g., nanoimprint template) for a semiconductor device, a recording device, or a workpiece thereof.

With respect to the substrate (e.g., substrate 210 of apparatus 202 in FIG. 3), the substrate may include, but is not limited to, a substrate selected from a substrate for a semiconductor device, a substrate for a recording device, a substrate for a workpiece thereof, and a substrate for a related piece thereof, including a substrate for an imprint template (e.g., nanoimprint template) for a semiconductor device, a recording device, or a workpiece thereof. The substrate may include, but is not limited to, a substrate of a silicon-based material selected from glass, quartz, silicon, and silicon nitride ($Si_3N_4$).

With respect to the optional hard mask (e.g., hard mask 220 of apparatus 202 of FIG. 3), the hard mask may include, but is not limited to, a hard mask selected from a hard mask for lithography (e.g., microlithography, nanolithography, etc.), a hard mask for semiconductor device processing, a hard mask for recording device processing, and the like. The hard mask may include, but is not limited to, a hard mask of a material selected from chromium, silicon dioxide, and aluminum oxide.

With respect to the resist or soft mask (e.g., the patterned resist or soft mask 230 of apparatus 202 of FIG. 3), the resist may include, but is not limited to, a resist selected from a resist for lithography (e.g., microlithography, nanolithography, etc.), a resist for semiconductor device processing, a resist for recording device processing, and the like, which may include a thermal-imprint resist or a UV-curable resist. The resist may include, but is not limited to, a polymer selected from an organic polymer and a mixed inorganicorganic polymer (e.g., polysiloxanes), which polymer may have any of variously available microstructures, architectures (e.g., copolymers, including block copolymers), cross-linkages, etc., and which polymer may be self-assembled polymer (e.g., from directed self-assembly of block copolymers). The resist may include, but is not limited to, a resist of a material selected from poly(methyl methacrylate) ("PMMA"), polycarbonate ("PC"), polystyrene ("PS"), polyethylene ("PE"), polypropylene ("PP"), polybutylene terephthalate ("PBT"), polyethylene terephthalate ("PET"), poly (dimethyl siloxane)-polystyrene diblock copolymer ("PDMS-b-PS"), poly(dimethyl siloxane)-graft-poly(methyl acrylate)-co-poly(isobornyl acrylate) ("PDMS-g-PMIA"), poly(dimethyl siloxane)-graft-poly(methyl methacrylate ("PDMS-g-PMMA"), a cyclic olefin copolymer, a polymeric material derived from a methyl methacrylate precursor, and a polymeric material derived from a epoxypropoxy-based precursor.

With respect to the sidewall-protecting material (e.g., sidewall-protecting material 240 of apparatus 202 of FIG. 3), the sidewall-protecting material facilitates maintaining pattern fidelity during pattern transfer, high-fidelity pattern transfer, and/or minimizing deterioration in the quality of transferred patterns. The sidewall-protecting material may be conformally deposited, thereby maintaining at least the certain shape and/or the center-to-center pitch of the features a and b. Conformal deposition of the sidewall-protecting material may include a completely conformal deposition (e.g., atomic layer deposition) or a partially conformal deposition (e.g., chemical vapor deposition, sputtering, etc.). Conformal deposition of the sidewall-protecting material may include chemical deposition of the sidewall-protecting material, including, but not limited to, chemical deposition selected from plating, chemical solution deposition ("CSD"), chemical bath deposition ("CBD"), spin coating, chemical vapor deposition ("CVD"), plasma enhanced chemical vapor deposition ("PECVD"), and atomic layer deposition ("ALD"). The foregoing is not intended to be limiting as conformal deposition of the sidewall-protecting material is not limited to chemical deposition, as conformal deposition of the sidewall-protecting material may further include, for example, physical deposition (e.g., sputtering).

Further with respect to the sidewall-protecting material, the sidewall-protecting material may be any material that may be conformally deposited, for example, using one or more of the foregoing types of chemical deposition. The sidewall-protecting material may be any material that may be selectively removed (e.g., by dry etching, such as dry plasma etching, including RIE) for effecting subsequent pattern transfer steps. The sidewall-protecting material may include, but is not limited to, a material selected from a metal (e.g., Ru, Ir, Pt, etc.), an oxide (e.g., $SiO_2$; a metal oxide including $Al_2O_3$, $TiO_2$, $SnO_2$, $ZnO$, $HfO_2$, etc.; etc.), a nitride (e.g., $Si_3N_4$; a metal nitride including TiN, TaN, WN, NbN, etc.; etc.), and a sulfide (e.g., a metal sulfide including ZnS, etc.). The foregoing is not intended to be limiting as the sidewall-protecting material may further include, for example, metalloids (e.g., Si, Ge, etc.).

Even further with respect to the sidewall-protecting material, the sidewall-protecting material may be conformally deposited at any thickness that facilitates maintaining pattern fidelity during pattern transfer, high-fidelity pattern transfer, and/or minimizing deterioration in the quality of transferred patterns. The thickness of the sidewall-protecting material may include a lateral thickness, including the thickness of the sidewall-protecting material on the sidewalls of the features of the patterned resist; a vertical thickness, including the thickness of the sidewall-protecting material on top of the features of the patterned resist or in recesses between the features of the patterned resist; or both the lateral thickness and the vertical thickness, wherein the thickness may be dependent upon the conformal deposition (e.g., completely conformal deposition or partially conformal deposition). In some embodiments, for example, the sidewall-protecting material may be conformally deposited at a thickness of at least 0.1 nm, 1.0 nm, 1.1 nm, 1.2 nm, 1.3 nm, 1.4 nm, 1.5 nm, 1.6 nm, 1.7 nm, 1.8 nm, 1.9 nm, 2.0 nm, 2.1 nm, 2.2 nm, 2.3 nm, 2.4 nm, or 2.5 nm. In some embodiments, for example, the sidewall-protecting material may be conformally deposited at a thickness of no more than 2.5 nm, 2.4 nm, 2.3 nm, 2.2 nm, 2.1 nm, 2.0 nm, 1.9 nm, 1.8 nm, 1.6 nm, 1.5 nm, 1.4 nm, 1.3 nm, 1.2 nm, 1.0 nm, or 0.1 nm. Combinations of the foregoing may be used to describe the thickness at which the sidewall-protecting material may be conformally deposited. In some embodiments, for example, the sidewall-protecting material may be conformally deposited at a thickness of at least 0.1 nm and no more than 2.5 nm (e.g., inclusively between 0.1 nm and 2.5 nm), such as at least 1.0 nm and no more than 2.0 nm (e.g., inclusively between 1.0 nm and 2.0 nm), including at least 1.5 nm and no more than 2.0 nm (e.g., inclusively between 1.5 nm and 2.0 nm). The foregoing is not intended to be limiting as the sidewall-protecting material may be conformally deposited and/or controllably deposited at greater or lesser thicknesses depending upon feature resolution (e.g., features a and b of apparatus 202 of FIG. 3). A lower feature resolution allows a sidewall-protecting material to have a greater thickness (e.g., more than 2.5 nm), whereas a higher feature resolution benefits from a sidewall-protecting material having a lesser thickness, which lesser thickness minimizes merging of adjacent features by the sidewall-protecting material. In an example of the foregoing, FIG. 8 provides Images (A) and (B), wherein Image (A) is a top-view image of the apparatus 202 of FIG. 5 having a 2 nm-thick sidewall-protecting material or layer, and wherein Image (A) is a top-view image of the apparatus 202 of FIG. 5 having a 1.5 nm-thick sidewall-protecting material or layer. As evidenced by some merging of adjacent features in Image (A), the higher feature resolution of apparatus 202 benefits from a sidewall-protecting material or layer having a lesser thickness.

In view of the foregoing, and in some non-limiting embodiments, for example, ALD may be used to conformally deposit a sidewall-protecting material of $SiO_2$ on at least a patterned resist. In such non-limiting embodiments, for example, the sidewall-protecting material may be about 1.5 nm thick. And in such non-limiting embodiments, for example, the sidewall-protecting material may be selectively removed by $CF_4$ RIE.

With respect to the features (e.g., the features a and b of apparatus 202 of FIG. 3, which features a and b are in cross-section), the features may include, but are not limited to, features individually or collectively having shapes selected from polyhedrons, such as prisms, including right prisms, parallelepipeds, and cubes; pillars or cylinders, such as right cylinders; spheres; and combinations thereof, such as sphere-and-pillar-type features. The foregoing is not intended to be limiting as the features may include features individually or collectively having, for example, elongated forms of the foregoing shapes (e.g., elongated parallelepipeds forming lines or a line-type features, for example, arranged as lamellae).

Further with respect to the features, the features may include, but are not limited to, features individually or collectively selected from micrometer-sized (or microlithographic-sized) features and nanometer-sized (or nanolithographic-sized) features, wherein micrometer-sized (or microlithographic-sized) features are features that admit of μm as measured and/or may be ≥10 μm (minor dimension), and wherein nanometer-sized (or nanolithographic-sized) features are features that admit of nm as measured and/or may be ≥100 nm (minor dimension). In some embodiments, for example, the features may individually or collectively be at least 1 nm, 2 nm, 3 nm, 4 nm, 5 nm, 6 nm, 7 nm, 8 nm, 9 nm, 10 nm, 11 nm, 12 nm, 13 nm, 14 nm, 15 nm, 16 nm, 17 nm, 18 nm, 19 nm, or 20 nm in a minor dimension. In some embodiments, for example, the features may individually or collectively be no more 20 nm, 19 nm, 18 nm, 17 nm, 16 nm, 15 nm, 14 nm, 13 nm, 12 nm, 11 nm, 10 nm, 9 nm, 8 nm, 7 nm, 6 nm, 5 nm, 4 nm, 3 nm, 2 nm, or 1 nm in a minor dimension. Combinations of the foregoing may be used to describe individually or collectively sized features. In some embodiments, for example, the features may individually or collectively be at least 1 nm and no more than 20 nm (e.g., inclusively between 1 nm and 20 nm) in a minor dimension, such as at least 5 nm and no more than 15 nm (e.g., inclusively between 5 nm and 15 nm) in a minor dimension, including at least 8 nm and no more than 12 nm (e.g., inclusively between 8 nm and 11 nm) in a minor dimension, for example, at least 9 nm and no more than 10 nm (e.g., inclusively between 9 nm and 10 nm) in a minor dimension. The foregoing is not intended to be limiting as the features may individually or collectively be sized as appropriate per apparatus (e.g., semiconductor device, recording device, a workpiece thereof, or a related piece thereof).

Even further with respect to the features, the features may include a pitch between similar features (e.g., similarly sized features and/or similarly shaped features), such as a center-to-center pitch, which pitch may be selected from a micrometer-sized pitch and nanometer-sized pitch, wherein a micrometer-sized pitch admits of μm as measured, and wherein a nanometer-sized pitch admits of nm as measured. In some embodiments, for example, the pitch may be at least 1 nm, 5 nm, 6 nm, 7 nm, 8 nm, 9 nm, 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, or 25 nm between similar features. In some embodiments, for example, the pitch may be no more than 25 nm, 24 nm, 23 nm, 22 nm, 21 nm, 20 nm, 19 nm, 18 nm, 17 nm, 16 nm, 15 nm, 14 nm, 13 nm, 12 nm, 11 nm, 10 nm, 9 nm, 8 nm, 7 nm, 6 nm, or 1 nm between similar features. Combinations of the foregoing may be used to describe the pitch between similar features. In some embodiments, for example, the pitch may be at least 1 nm and no more than 25 nm (e.g., inclusively between 1 nm and 25 nm) between similar features, such as at least 5 nm and no more than 25 nm (e.g., inclusively between 5 nm and 25 nm) between similar features, including at least 10 nm and no more than 25 nm (e.g., inclusively between 10 nm and 25 nm) between similar features, for example, at least 15 nm and no more than 20 nm (e.g., inclusively between 15 nm and 20 nm) between similar features, and, for example, at least 18 nm and no more than 20 nm (e.g., inclusively between 18 nm and 20 nm) between similar features. The foregoing is not intended to be limiting as the pitch may be sized as appropriate per apparatus (e.g., semiconductor device, recording device, a workpiece thereof, or a related piece thereof).

In view of the foregoing, and in some non-limiting embodiments, for example, the features may be pillars or cylinders, including sphere-and-pillar-type features. In such non-limiting embodiments, for example, the features may be at least 8 nm and no more than 12 nm (e.g., inclusively between 8 nm and 11 nm) in a minor dimension. And in such non-limiting embodiments, for example, the center-to-center pitch may be at least 15 nm and no more than 20 nm (e.g., inclusively between 15 nm and 20 nm) between features.

With respect to maintaining pattern fidelity during pattern transfer, high-fidelity pattern transfer, and/or minimizing deterioration in the quality of transferred patterns, the plurality of features of the resist may be transferred to the substrate such that the resulting features of the substrate are of the same average size as the features of the resist, including the same average size in at least a minor dimension. The plurality of features of the resist may be transferred to the substrate such that the resulting features of the substrate are in the same average position as the features of the resist. There may be a standard deviation a associated with the foregoing same average size and/or the foregoing same average position. In some embodiments, for example, the standard deviation a associated with the foregoing same average size and/or the foregoing same average position is at least 0.5 nm, 1.0 nm, 1.5 nm, 2.0 nm, 2.5 nm, 3.0 nm, 3.5 nm, 4.0 nm, 4.5 nm, or 5.0 nm. In some embodiments, for example, the standard deviation a associated with the foregoing same average size and/or the foregoing same average position is no more than 5.0 nm, 4.5 nm, 4.0 nm, 3.5 nm, 3.0 nm, 2.5 nm, 2.0 nm, 1.5 nm, 1.0 nm, or 0.5 nm. Combinations of the foregoing may be used to describe the standard deviation a associated with the foregoing same average size and/or the foregoing same average position. In some embodiments, for example, the standard deviation a associated with the foregoing same average size and/or the foregoing same average position may be at least 0.5 nm and no more than 5.0 nm (e.g., inclusively between 0.5 nm and 5.0 nm), such as at least 0.5 nm and no more than 3.0 nm (e.g., inclusively between 0.5 nm and 3.0 nm), including at least 1.0 nm and no more than 2.0 nm (e.g., inclusively between 1.0 nm and 2.0 nm), for example, at least 1.0 nm and no more than 1.5 nm (e.g., inclusively between 1.0 nm and 1.5 nm). The foregoing is not intended to be limiting to the standard deviation a associated with the foregoing same average size and/or the foregoing same average position.

In view of certain general features of apparatuses and methods provided herein, which were described in reference to FIG. 3, FIGS. 2-5, 6A, and 6B will now be described. FIGS. 2-5, 6A, and 6B provide examples of apparatuses and methods including sidewall protection for features for maintaining pattern fidelity during pattern transfer, high-fidelity pattern transfer, and/or minimizing deterioration in the quality of transferred patterns through sidewall protection.

FIG. 2, for example, illustrates an apparatus 200 in cross-section including a substrate 210 (e.g., silicon-based material such as Si or quartz), a patterned resist or soft mask 230 (e.g., a $CF_4$ RIE-labile resist) overlying the substrate 210, and features a and b of the patterned resist 230, which features a and b may be of a certain size (e.g., 9-10 nm) and/or shape (e.g., pillar) with a certain center-to-center pitch (e.g., 18-20 nm) for transferring to the underlying substrate 210. A sidewall-protecting material 240 (e.g., $SiO_2$) may be conformally deposited (e.g., by ALD) on the apparatus 200 to yield apparatus 202 including the sidewall-protecting material 240 overlying the patterned resist 230 and/or the substrate 210, in which apparatus 202 the features a and b of the patterned resist 230 and the sidewall-protecting material 240 retain at least the certain shape (e.g., pillar) and the center-to-center pitch (e.g., 18-20 nm). The certain size of the features a and b may be of a slightly increased size in accordance with the thickness of the conformally deposited sidewall-protecting material; however, the increased size of the sidewall-protected features may be accommodated by starting with slightly smaller-sized features of the patterned resist 230, by subsequent processing steps (e.g., specifically tuned RIE conditions and/or increased RIE duration), or by starting with slightly smaller-sized features and by subsequent processing steps. The features a and b of the patterned resist 230 and sidewall-protecting material 240 may be transferred to the substrate 210 of the apparatus 202 by a substrate-etching process such as RIE (e.g., $CF_4$ RIE) yielding apparatus 204 including etched substrate 212 having features a and b of the desired size (e.g., 9-10 nm) and/or shape (e.g., pillar) with the desired center-to-center pitch (e.g., 18-20 nm), thereby effecting high-fidelity pattern transfer.

FIG. 3, for example, illustrates an apparatus 200 in cross-section including a substrate 210 (e.g., silicon-based material such as Si or quartz), a hard mask 220 (e.g., Cr) overlying the substrate 210, a patterned resist or soft mask 230 (e.g., a $CF_4$ RIE-labile resist) overlying the hard mask 220, and/or the substrate 210, and features a and b of the patterned resist 230, which features a and b may be of a certain size (e.g., 9-10 nm) and/or shape (e.g., pillar) with a certain center-to-center pitch (e.g., 18-20 nm) for transferring to the underlying substrate 210. A sidewall-protecting material 240 (e.g., $SiO_2$) may be conformally deposited (e.g., by ALD) on the apparatus 200 to yield apparatus 202 including the sidewall-protecting material 240 overlying the patterned resist 230, the hard mask 220, and/or the substrate 210, in which apparatus 202 the features a and b of the patterned resist 230 and the sidewall-protecting material 240 retain at least the certain shape (e.g., pillar) and the center-to-center pitch (e.g., 18-20 nm). As described herein, the certain size of the features a and b may be of a slightly increased size in accordance with the thickness of the conformally deposited sidewall-protecting material, but the increased size may be accommodated. A bottom portion of the sidewall-protecting material may be removed, for example, by etching (e.g., $CF_4$ RIE) to yield apparatus 204, in which the underlying hard mask 220 is exposed, and in which the protection of the sidewalls of features a and b is maintained with etched sidewall-protecting material 242. A portion of the hard mask 220 may be removed, for example, by etching (e.g., $Cl_2/O_2$ RIE), to yield apparatus 206, in which the underlying substrate 210 is exposed, and in which the protection of the sidewalls of features a and b is still maintained with etched sidewall-protecting material 242. The features a and b of the patterned resist 230, the etched sidewall-protecting material 242, and the etched hard mask 222 may be transferred to the substrate 210 of the apparatus 206, for example, by a substrate-etching process (e.g., $CF_4$ RIE) yielding apparatus 208 including etched substrate 212 having features a and b of the desired size (e.g., 9-10 nm) and/or shape (e.g., pillar) with the desired center-to-center pitch (e.g., 18-20 nm). While not shown in FIG. 3, the etched hard mask 222 may be subsequently removed, if desired, for example, by etching (e.g., $Cl_2/O_2$ RIE), to yield an apparatus in which features a and b of the etched substrate 212 have the desired size (e.g., 9-10 nm) and/or shape (e.g., pillar) with the desired center-to-center pitch (e.g., 18-20 nm), thereby effecting high-fidelity pattern transfer.

FIG. 4, for example, illustrates an apparatus 200 in cross-section including a substrate 210 (e.g., silicon-based material such as Si or quartz), a patterned resist or soft mask 230 (e.g., a $CF_4$ RIE-labile resist such as PDMS-b-PS) overlying the substrate 210, and features a and b of the patterned resist 230, which features a and b may be of a certain size (e.g., 9-10 nm) and/or shape (e.g., poly[dimethyl siloxane] sphere supported by a polystyrene pillar) with a certain center-to-center pitch (e.g., 18-20 nm) for transferring to the underlying substrate 210. A sidewall-protecting material 240 (e.g., $SiO_2$) may be conformally deposited (e.g., by ALD) on the apparatus 200 to yield apparatus 202 including the sidewall-protecting material 240 overlying the patterned resist 230 and/or the substrate 210, in which apparatus 202 the features a and b of the patterned resist 230 and the sidewall-protecting material 240 retain at least the certain shape (e.g., sphere supported by a pillar) and the center-to-center pitch (e.g., 18-20 nm). As described herein, the certain size of the features a and b may be of a slightly increased size in accordance with the thickness of the conformally deposited sidewall-protecting material, but the increased size may be accommodated. The features a and b of the patterned resist 230 and sidewalk protecting material 240 may be transferred to the substrate 210 of the apparatus 202 by a substrate-etching process such as RIE (e.g., $CF_4$ RIE) yielding apparatus 204 including etched substrate 212 having features a and b of the desired size (e.g., 9-10 nm) and/or shape (e.g., pillar) with the desired center-to-center pitch (e.g., 18-20 nm), thereby effecting high-fidelity pattern transfer.

FIG. 5, for example, illustrates an apparatus 200 in cross-section including a substrate 210 (e.g., silicon-based material such as Si or quartz), a hard mask 220 (e.g., Cr) overlying the substrate 210, a patterned resist or soft mask 230 (e.g., PDMS-b-PS) overlying the hard mask 220, and/or the substrate 210, and features a and b of the patterned resist 230, which features a and b may be of a certain size (e.g., 9-10 nm) and/or shape (e.g., sphere-and-pillar-type feature including a sphere of poly[dimethyl siloxane] and a pillar of polystyrene) with a certain center-to-center pitch (e.g., 18-20 nm) for transferring to the underlying substrate 210. (See Image [A] of FIG. 7.) A sidewall-protecting material 240 (e.g., $SiO_2$) may be conformally deposited (e.g., by ALD) on the apparatus 200 to yield apparatus 202 including the sidewall-protecting material 240 overlying the patterned resist 230, the hard mask 220, and/or the substrate 210, in which apparatus 202 the features a and b of the patterned resist 230 and the sidewall-protecting material 240 retain at least the certain shape (e.g., sphere-and-pillar-type feature) and the center-to-center pitch (e.g., 18-20 nm). (See transmission electron microscope ["TEM"] image below apparatus 202 of FIG. 5, and see Image [B] of FIG. 7.) As described herein, the certain size of the features a and b may be of a slightly increased size in accordance with the thickness of the conformally deposited sidewall-protecting material, but the increased size may be accommodated. A bottom portion of the sidewall-protecting material may be removed, for example, by etching (e.g., $CF_4$ RIE), to yield apparatus 204, in which the underlying hard mask 220 is exposed, and in which the protection of the sidewalls of features a and b is maintained with etched sidewall-protecting material 242. As illustrated in FIG. 5, a top portion of the patterned resist 230 may also be exposed when the portion of the sidewall-protecting material is removed to expose the hard mask 220; however, importantly, the protection of the sidewalls of features a and b is maintained with etched sidewall-protecting material 242. A portion of the hard mask 220 may be removed, for example, by etching (e.g., $Cl_2/O_2$ RIE), to yield apparatus 206, in which the underlying substrate 210 is exposed, and in which the protection of the sidewalls of features a and b is still maintained with etched sidewall-protecting material 242. The features a and b of the patterned resist 230, the etched sidewall-protecting material 242, and the hard etched mask 222 may be transferred to the substrate 210 of the apparatus 206, for example, by a substrate-etching process (e.g., $CF_4$ RIE) yielding apparatus 208 including etched substrate 212 having features a and b of the desired size (e.g., 9-10 nm) and/or shape (e.g., pillar) with the desired center-to-center pitch (e.g., 18-20 nm). (See Image [C] of FIG. 7.) While not shown in FIG. 5, the etched hard mask 222 may be subsequently removed, if desired, for example, by etching (e.g., $Cl_2/O_2$ RIE), to yield an apparatus in which features a and b of the etched substrate 212 have the desired size (e.g., 9-10 nm) and/or shape (e.g., pillar) with the desired center-to-center pitch (e.g., 18-20 nm), thereby effecting high-fidelity pattern transfer.

In view of FIG. 2-5, FIGS. 6A and 6B provide flow charts for maintaining pattern fidelity during pattern transfer, high-fidelity pattern transfer, and/or minimizing deterioration in the quality of transferred patterns through sidewall protection. FIG. 6A, for example, provides a flow chart in accordance with FIGS. 2 and 4 and the description for FIGS. 2 and 4 provided herein. FIG. 6B, for example, provides a flow chart in accordance with FIGS. 3 and 5 and the description for FIGS. 3 and 5 provided herein.

As provided herein in reference to FIG. 5, FIG. 7 provides Images (A-C), wherein Image (A) is a top-view image of the apparatus 200 of FIG. 5, wherein Image (B) is a top-view image of the apparatus 202 of FIG. 5, and wherein Image (C) is a top-view image of the apparatus 208 of FIG. 5. In addition, FIG. 8 provides Images (A) and (B), wherein Image (A) is a top-view image of the apparatus 202 of FIG. 5 having a 2 nm-thick sidewall-protecting material or layer, and wherein Image (A) is a top-view image of the apparatus 202 of FIG. 5 having a 1.5 nm-thick sidewall-protecting material or layer. Contrasted with Images (A) and (B) of FIG. 1D, the images of FIGS. 6 and 7 evidence the apparatuses and methods for maintaining pattern fidelity during pattern transfer, high-fidelity pattern transfer, and/or minimizing deterioration in the quality of transferred patterns, which apparatuses and methods include, but are not limited to, sidewall protection for features for facilitating the foregoing (e.g., high-fidelity pattern transfer).

As such, provided herein is an apparatus, comprising a patterned resist overlying a substrate; a plurality of features of the patterned resist, wherein the plurality of features respectively comprises a plurality of sidewalls; and a sidewall-protecting material disposed about the plurality of sidewalls, wherein the sidewall-protecting material is characteristic of a conformal, thin-film deposition, and wherein the sidewall-protecting material facilitates a high-fidelity pattern transfer of the patterned resist to the substrate during etching. In some embodiments, the high-fidelity pattern transfer creates a plurality of features of a patterned substrate respectively having the same average size in at least a minor dimension as the plurality of features of the patterned resist with a standard deviation less than 1.5 nm. In some embodiments, each feature of the plurality of features of the patterned resist is about 10 nm or less in its minor dimension. In some embodiments, a center-to-center pitch between features of the plurality of features of the patterned resist is about 20 nm or less. In some embodiments, the patterned resist comprises a polymer. In some embodiments, the patterned resist comprises a diblock copolymer comprising poly(dimethyl siloxane) and polystyrene. In some embodiments, each feature of the plurality of features of the patterned resist comprises a poly(dimethyl siloxane) sphere supported by a polystyrene pillar. In some embodiments, the sidewall-protecting material has a lateral thickness of about 2 nm or less. In some embodiments, the conformal thin-film deposition is atomic layer deposition, chemical vapor deposition, or sputtering. In some embodiments, the sidewall-protecting material comprises $SiO_2$ or Si. In some embodiments, the apparatus further comprises a hard mask disposed between the patterned resist and the substrate. In some embodiments, the substrate comprises a silicon-based material.

Also provided herein is an apparatus, comprising a hard mask overlying a substrate; a patterned resist overlying the substrate comprising a plurality of polymer-based features, wherein the plurality of features respectively comprises a plurality of sidewalls; and a sidewall-protecting material conformally deposited about the plurality of sidewalls, wherein the sidewall-protecting material facilitates a high-fidelity pattern transfer of the patterned resist to the substrate during etching. In some embodiments, each feature of the plurality of features of the patterned resist is about 10 nm or less in its minor dimension. In some embodiments, a center-to-center pitch between features of the plurality of features of the patterned resist is about 20 nm or less. In some embodiments, the hard mask comprises chromium, the plurality of polymer-based features comprises a poly(dimethyl siloxane)-polystyrene diblock copolymer, the sidewall-protecting material comprises $SiO_2$ or Si; and the substrate comprises a silicon-based material selected from glass, quartz, silicon, and silicon nitride ($Si_3N_4$).

Also provided herein is a method, comprising conformally depositing a sidewall-protecting material by thin-film deposition about a plurality of features of a patterned resist respectively comprising a plurality of sidewalls; and etching a substrate underlying the patterned resist, wherein the sidewall-protecting material facilitates a high-fidelity pattern transfer of the patterned resist to the substrate. In some embodiments, the method further comprises etching the sidewall-protecting material to expose a hard mask overlying the substrate prior to etching the substrate. In some embodiments, the method further comprises etching the hard mask prior to etching the substrate. In some embodiments, the plurality of features comprises a poly(dimethyl siloxane)-polystyrene diblock copolymer; the sidewall-protecting material comprises $SiO_2$ or Si; and the substrate comprises a silicon-based material selected from glass, quartz, silicon, and silicon nitride ($Si_3N_4$).

Also provided herein is an apparatus, comprising a plurality of polymer-based sidewalls overlying a substrate; and a sidewall-protecting material conformally deposited about the plurality of sidewalls, wherein the sidewall-protecting material facilitates a high-fidelity pattern transfer of a patterned resist to the substrate. In some embodiments, the polymer of the polymer-based sidewalls comprises a diblock copolymer comprising poly(dimethyl siloxane) and polystyrene. In some embodiments, the sidewall-protecting material is characteristic of atomic layer deposition. In some embodiments, the sidewall-protecting material has a thickness of about 2 nm or less. In some embodiments, the sidewall-protecting material comprises $SiO_2$.

Also provided is an apparatus, comprising a plurality of sidewalls overlying a substrate; and a sidewall-protecting material conformally deposited about the plurality of sidewalls, wherein the sidewall-protecting material facilitates a high-fidelity pattern transfer of a pattern to the substrate. In some embodiments, the sidewalls comprise a diblock copolymer comprising poly(dimethyl siloxane) and polystyrene. In some embodiments, the sidewall-protecting material is characteristic of atomic layer deposition, chemical vapor deposition, or sputtering. In some embodiments, the sidewall-protecting material has a lateral thickness of about 2 nm or less. In some embodiments, the sidewall-protecting material comprises $SiO_2$ or Si.

While some particular embodiments have been illustrated and/or described herein, and while the particular embodiments have been illustrated and/or described in some detail, it is not the intention of the applicant(s) for the particular embodiments to limit the scope of the concepts presented herein. Additional adaptations and/or modifications may readily appear to persons having ordinary skill in the art, and, in broader aspects, these adaptations and/or modifications may be encompassed as well. Accordingly, departures may be made from the particular embodiments illustrated and/or described herein without departing from the scope of the concepts provided herein. The implementations provided herein and other implementations are within the scope of the following claims.

What is claimed is:

1. An apparatus, comprising:
   a patterned resist overlying a substrate;
   a plurality of self-assembled, polymer-based features of the patterned resist,
   wherein the plurality of features respectively comprises a plurality of sidewalls; and
   a sidewall-protecting material disposed about the plurality of sidewalls,
   wherein the sidewall-protecting material is characteristic of a conformal, thin-film deposition, and
   wherein the sidewall-protecting material facilitates a high-fidelity pattern transfer of the patterned resist to the substrate during etching.

2. The apparatus of claim 1,
   wherein the high-fidelity pattern transfer creates a plurality of features of a patterned substrate having the same average size in at least a minor dimension as the plurality of features of the patterned resist with a standard deviation less than 1.5 nm.

3. The apparatus of claim 1,
   wherein each feature of the plurality of features of the patterned resist is about 10 nm or less in its minor dimension.

4. The apparatus of claim 1,
   wherein a center-to-center pitch between features of the plurality of features of the patterned resist is about 20 nm or less.

5. The apparatus of claim 1,
   wherein the polymer of the plurality of features comprises a diblock copolymer comprising poly(dimethyl siloxane) and polystyrene.

6. The apparatus of claim 1,
   wherein each feature of the plurality of features of the patterned resist comprises a poly(dimethyl siloxane) sphere supported by a polystyrene pillar.

7. The apparatus of claim 1,
   wherein the sidewall-protecting material has a lateral thickness of about 2 nm or less.

8. The apparatus of claim 1,
   wherein the conformal thin-film deposition is atomic layer deposition, chemical vapor deposition, or sputtering.

9. The apparatus of claim 1,
   wherein the sidewall-protecting material comprises $SiO_2$ or Si.

10. The apparatus of claim 1,
    wherein the apparatus further comprises a hard mask disposed between the patterned resist and the substrate.

11. The apparatus of claim 1,
    wherein the substrate comprises a silicon-based material.

12. An apparatus, comprising:
    a hard mask overlying a substrate;
    a patterned resist overlying the substrate comprising a plurality of polymer-based features,
    wherein a center-to-center pitch between features of the plurality of is about 20 nm or less, and
    wherein the plurality of features respectively comprises a plurality of sidewalls; and
    a sidewall-protecting material conformally deposited about the plurality of sidewalls,
    wherein the sidewall-protecting material facilitates a high-fidelity pattern transfer of the patterned resist to the substrate during etching.

13. The apparatus of claim 12,
    wherein each feature of the plurality of features of the patterned resist is about 10 nm or less in its minor dimension.

14. The apparatus of claim 12,
    wherein the hard mask comprises chromium, the plurality of polymer-based features comprises a poly(dimethyl siloxane)-polystyrene diblock copolymer, the sidewall-protecting material comprises $SiO_2$ or Si; and the substrate comprises a silicon-based material selected from glass, quartz, silicon, and silicon nitride ($Si_3N_4$).

15. An apparatus, comprising:
    a plurality of block copolymer-based sidewalls overlying a substrate; and
    a sidewall-protecting material conformally deposited about the plurality of sidewalls,
    wherein the sidewall-protecting material facilitates a high-fidelity pattern transfer of a pattern to the substrate.

16. The apparatus of claim 15,
    wherein the block copolymer of the sidewalls comprises a diblock copolymer.

17. The apparatus of claim 15,
    wherein the block copolymer of the sidewalls comprises poly(dimethyl siloxane) and polystyrene.

18. The apparatus of claim 15,
    wherein the sidewall-protecting material is characteristic of atomic layer deposition, chemical vapor deposition, or sputtering.

19. The apparatus of claim 15,
    wherein the sidewall-protecting material has a lateral thickness of about 2 nm or less.

20. The apparatus of claim 15,
    wherein the sidewall-protecting material comprises $SiO_2$ or Si.

21. The apparatus of claim 15,
    wherein the sidewalls correspond to nanometer-sized features of a patterned resist.

22. An apparatus, comprising:
    a patterned resist overlying a substrate comprising a plurality of polymer-based features,
    wherein a center-to-center pitch between adjacent features of the plurality of features is about 20 nm or less, and
    wherein each feature of the plurality of features is about 10 nm or less in its minor dimension; and
    a sidewall-protecting material conformally deposited about a plurality of sidewalls of the plurality of features,
    wherein the sidewall-protecting material facilitates a high-fidelity pattern transfer of the patterned resist to the substrate during etching.

23. The apparatus of claim 22,
    wherein the sidewall-protecting material comprises $SiO_2$ or Si with a lateral thickness of about 2 nm or less.

24. The apparatus of claim 23,
    wherein each feature of the plurality of features comprises a poly(dimethyl siloxane) sphere supported by a polystyrene pillar.

25. The apparatus of claim 24, further comprising:
    a hard mask of chromium in-between the patterned resist and the substrate, wherein the substrate comprises a silicon-based material selected from glass, quartz, silicon, and silicon nitride ($Si_3N_4$).

* * * * *